United States Patent [19]

Ginami et al.

[11] Patent Number: 5,486,487
[45] Date of Patent: Jan. 23, 1996

[54] METHOD FOR ADJUSTING THE THRESHOLD OF A READ-ONLY MEMORY TO ACHIEVE LOW CAPACITANCE AND HIGH BREAKDOWN VOLTAGE

[75] Inventors: Giancarlo Ginami, Bergamo; Enrico Laurin, Monza; Silvia Lucherini, Milan; Bruno Vajana, Bergamo, all of Italy

[73] Assignee: SGS-Thomson Microelectronics S.r.l., Milan, Italy

[21] Appl. No.: 139,800

[22] Filed: Oct. 19, 1993

Related U.S. Application Data

[63] Continuation-in-part of Ser. No. 678,557, Mar. 29, 1991, abandoned.

[30] Foreign Application Priority Data

Mar. 30, 1990 [IT] Italy .................................. 19903/90

[51] Int. Cl.⁶ .................................................. H01L 21/266
[52] U.S. Cl. .............................. 437/45; 432/48; 432/149; 432/931
[58] Field of Search ..................... 437/44, 45, 48, 437/148, 149, 150, 931; 148/DIG. 13

[56] References Cited

U.S. PATENT DOCUMENTS

| | | | |
|---|---|---|---|
| 4,261,761 | 4/1981 | Sato et al. | 437/44 |
| 4,268,950 | 5/1981 | Chatterjee et al. | 437/45 |
| 4,288,806 | 9/1981 | Ronen | 257/409 |
| 4,291,321 | 9/1981 | Pfleiderer et al. | 257/336 |
| 4,296,426 | 10/1981 | Gilles | 257/336 |
| 4,359,817 | 11/1982 | Dickman et al. | 437/48 |
| 4,513,494 | 4/1985 | Batra | 437/931 |
| 4,514,897 | 5/1985 | Chiu et al. | 437/48 |
| 4,837,181 | 6/1989 | Galblati et al. | 437/45 |
| 4,990,982 | 2/1991 | Omoto et al. | 257/409 |

FOREIGN PATENT DOCUMENTS

| | | |
|---|---|---|
| 0073130 | 3/1983 | European Pat. Off. . |
| 54-99578 | 8/1979 | Japan . |
| 60-198780 | 10/1985 | Japan . |
| 62-188360 | 8/1987 | Japan . |

*Primary Examiner*—Chandra Chaudhari
*Attorney, Agent, or Firm*—David V. Carlson; Seed and Berry

[57] ABSTRACT

A method of manufacture of a low-capacitance programmed cell structure for read-only memory circuits comprises a field-effect transistor having conventional source and drain regions separated by a channel region overlaid by the gate of the transistor. This ROM memory cell is programmed by a channel implant extending only from the source region for a selected distance into the channel region.

10 Claims, 6 Drawing Sheets

METHOD FOR ADJUSTING THE THRESHOLD OF A READ-ONLY MEMORY TO ACHIEVE LOW CAPACITANCE AND HIGH BREAKDOWN VOLTAGE

CROSS-REFERENCE TO RELATED APPLICATION

This patent application is a continuation-in-part of U.S. Ser. No. 07/678,557, filed Mar. 29, 1991 by Giancarlo Ginami, Enrico Laurin, Silvia Lucherini and Bruno Vajana, which application is hereby abandoned.

TECHNICAL FIELD

This invention relates to a method of manufacture for a low-capacitance, high breakdown voltage programmed cell for read-only memory circuits.

BACKGROUND OF THE INVENTION

It is a known fact that read-only circuit structures or ROMs (Read-Only Memories) are basically comprised of regular cell arrays.

The memory is programmed, in general, by making some predetermined cells nonconductive, thereby logic signals are output which are tied to the value of the input signals in a sought relationship.

Each cell basically comprises a transistor operating on a gate voltage Vg of 5 volts. That is, all the gates of the cells in the array are connected to a common 5-volt power source.

Between a programmed cell and a nonprogrammed one, there should be a current difference of some hundreds microamperes to permit of discrimination therebetween during the read-out stage.

In order to obtain a large difference between such currents, the prior art has commonly proposed of raising the conduction threshold of the corresponding transistors to the cells to be programmed. This can be achieved by increasing the surface concentration of dopant in the transistor channel region, e.g., by the additional implantation of type "p" impurities with boron ions for an n-channel transistor.

However, the high surface concentration of the channel region and high doping of the adjacent drain region of the transistor cause the drain depletion zone to become small, which results in the drain capacitance becoming relatively high while the breakdown voltage is comparatively low.

In view of that the drain electrodes form the so-called bit line of a ROM, this bit line will exhibit a long charge time reflecting in a long access time to the memory.

SUMMARY OF THE INVENTION

According to principles of the present invention, this problem is solved by a cell structure as indicated being characterized in that it comprises a channel implant extending for a predetermined distance into the channel only from the source region. In a preferred embodiment, this distance is at least 10% of the distance separating the source region from the drain region, but less than 80%. In an alternative embodiment, this distance is less than 50% of the channel length.

This structure may be realized by a number of different methods. Accordingly, it is an object of the present invention to provide a method for adjusting the threshold of a read-only memory to achieve a low capacitance and a high breakdown voltage.

According to a preferred embodiment of practicing the method of manufacturing a ROM according to the present invention, an active area is defined in a semiconductor substrate. The semiconductor substrate has a first conductivity type. A gate electrode is formed overlying a channel region using techniques presently known in the art. A programming mask having a programming aperture is formed that overlays only a selected portion of the active area and masks other portions of the active area. A doping impurity is implanted into the active area of the first conductivity type. The doping impurity of the first conductivity type increases the doping concentration in the channel region into which it is implanted higher than the doping impurity concentration of the substrate. The appropriate steps are carried out either prior to or subsequent to the programming step to form the read only memory array.

Implanting the first doping impurity only into a selected portion of the active area advantageously provides a read only memory cell array in which the program cells have a high breakdown voltage and are recognized as being program cells and yet have a low capacitance.

The method of this invention has features and advantages which will become apparent from the following description of an embodiment thereof, given by way of illustration and not of limitation with reference to the accompanying drawings.

DETAILED DESCRIPTION OF THE INVENTION

Figure 1:
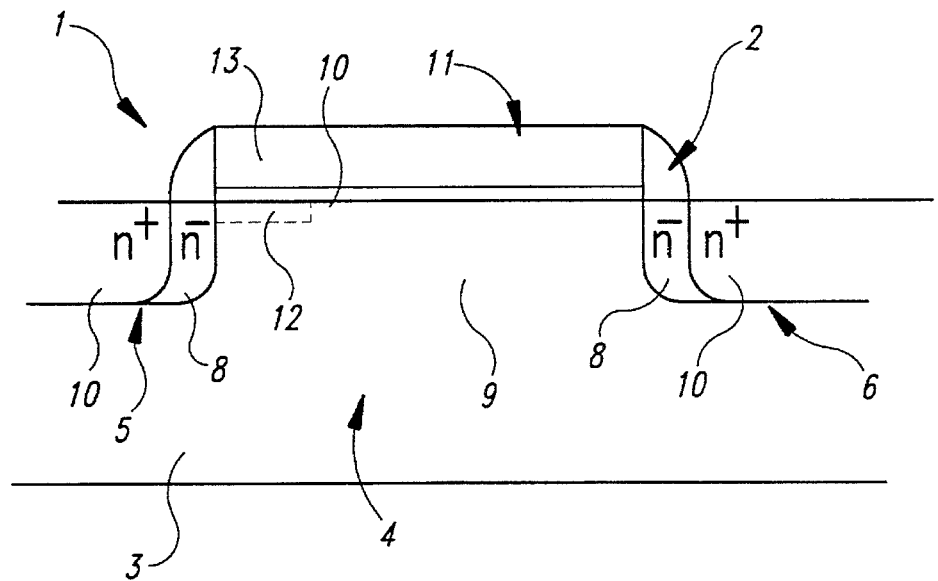
FIG. 1 is a vertical section view showing schematically a cell structure according to the invention.
Figure 2:
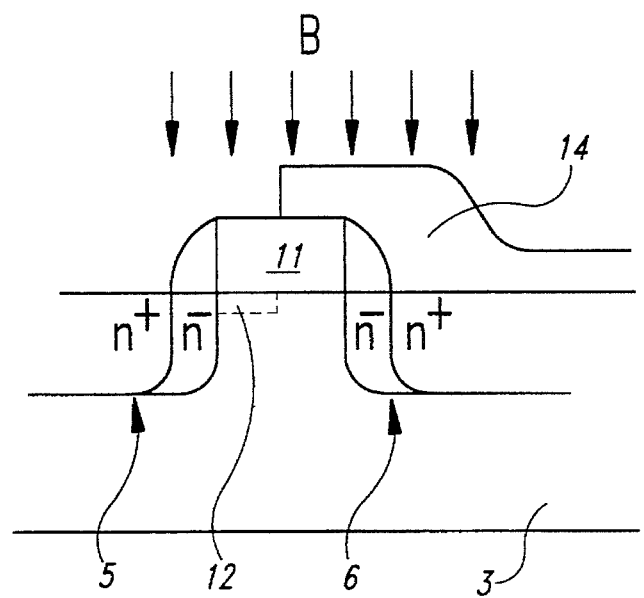
FIG. 2 is a further schematic representation of the cell structure shown in FIG. 1.

With reference to FIG. 1 schematically is shown the construction of an elemental cell of a semiconductor integrated circuit, such as a read-only memory or ROM, according to principles of the present invention.

The cell 1 is basically comprised of a field effect transistor 2 of the type formed by MOS technology on a semiconductor silicon substrate 3.

An array of memory cells is comprised of orderly sets of transistors 2, formed on the substrate 3.

Each transistor 2 includes an active area 4 having oppositely located source and drain regions 5 and 6 separated by a channel region 9.

Such channel regions 9 are modified by altering the structure of the substrate 3 through controlled implanted amounts of doping ions as will be discussed further below.

Each source 5 and drain 6 region is split into a portion 8 having a lower dopant concentration, for example, of the n-type, in the proximities of the channel region 9, and a portion 10 having a higher concentration of n+ dopant in the region spaced from the channel, for example, 10E16 atoms, /cm$^3$.

Over the region 9, there is a thin layer 10 of silicon dioxide onto which a layer 13 of polycrystalline silicon is deposited to define the gate 11 of transistor 2.

Advantageously, in accordance with the present invention, the cell 1 also includes a so-called channel implant 12 which only extends a predetermined distance from the source region 5. In a preferred embodiment, this distance is adjusted according to the distance between the source region 5 and the drain region 6 and is at least 10% thereof but less than 80% thereof. In one embodiment, the selected distance is less than 50%. The method of the present invention includes the construction of this channel implant 12 by which the cell is programmed.

In summary, in the programmed cell 1, the channel implant 12 is only provided on the source side, not on the drain side, as is clearly shown by FIG. 1.

For an n-channel device, the region 12 is provided by implantation of a p-type dopant, for example, boron ions.

A brief description of the programming of a ROM memory cell is useful for understanding the function and operation of the invention. A ROM memory cell is programmed by altering its response to a selected voltage applied to its gate. Within a single ROM memory array, some memory cells in the array are programmed and other memory cells in the array are not programmed, the not programmed cells being referred to as "non-programmed cells." A ROM cell is programmed by altering its capacity of responding to a voltage applied to its gate, so that a predetermined polarization of a number of the programmed and non-programmed cells will result in the programmed cell having drain currents significantly lower than the drain currents of the non-programmed cells. In other words, a ROM cell is programmed by raising its conduction threshold. When the selected voltage is applied, the programmed memory cells remain generally off, having a drain current significantly less than the drain current of the non-programmed cells.

Generally, programming a memory cell of a ROM is achieved in the prior art by a threshold ion implant that increases the impurity concentration of the entire channel region of the cell to be programmed. For a p-type substrate and an n-channel device, a p-type implantation is made into the channel region. This raises the conduction threshold of the programmed ROM cell so that when the gate voltage is applied the transistor has a very low current flow and generally remains off. This is achieved in the prior art by increasing the impurity concentration of the entire surface of the channel region of the cells to be programmed. However, this enhancement of the concentration of p-type impurities has the effect of reducing the depletion layer of the reverse biased drain junction, thus increasing the drain capacitance and reducing the drain breakdown voltage. Increasing the drain capacitance causes a higher reading time of the memory and reducing the breakdown voltage causes a limitation of the voltage which can be applied across the drain and the source electrodes.

According to principles of the present invention, a memory cell is programmed by implanting only a portion of the channel region that extends from the source with a p-type impurity to increase the concentration locally adjacent to the source region only. The higher impurity concentration only adjacent to source region is sufficient to program the memory cell for distinguishing a programmed memory cell from a nonprogrammed memory cell. By implanting only adjacent the source region, the drain capacitance of the memory cell remains essentially unchanged between a programmed and a non-programmed cell. That is, the drain capacitance for the programmed cell according to the invention is much lower than the drain capacitance of a programmed cell as performed in the prior art. In addition, the breakdown voltage of the programmed cell according to the invention remains unchanged, and is approximately equal to those of the non-programmed cell. However, the channel conductivity is altered sufficiently to differentiate between a programmed cell and a non-programmed cell.

The programming of the memory cell by implanting the impurity adjacent the source region raises the threshold voltage of the cell sufficiently that it can be distinguished from the threshold voltage of the nonprogrammed cell. One disadvantage of implanting only a portion of the channel region is that the threshold voltage of a cell programmed according to the invention is not raised quite as high as the prior art programmed memory cells. However, the length of the channel implant and the doping concentration is selected such that a programmed cell according to the invention can still be differentiated between a non-programmed cell, because the channel impurity concentrations and distance into the channel can be selected such that the threshold voltage for the programmed cell is sufficiently high for the gate voltage which is to be applied that the cells can be differentiated. Thus, the distinguishing characteristics between a programmed and non-programmed memory cell can be obtained without the significant disadvantages which occurred in the prior art.

The method resulting in the formation of the cell 1 according to the invention will be discussed next. It will be noted throughout that all processing disclosed herein may be carried out by any conventional processing scheme, and that all thicknesses and temperatures are in the range that are well known in the art to be suitable for the purposes presented.

Figure 3A:
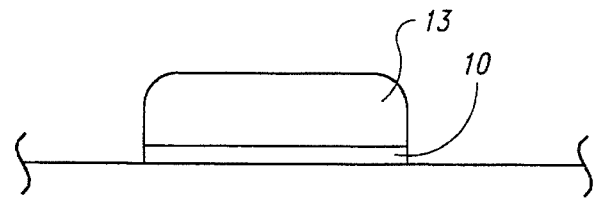
FIGS. 3a–3g are cross-section views showing schematically a cell structure at successive steps of manufacture according to a preferred embodiment of the invention.

With reference to FIG. 3a, a substrate 3 having a doping concentration of a first conductivity type is provided. Steps are carried out to define an active area for memory cell transistors, form a layer of silicon dioxide and deposit a layer of polycrystalline silicon. The appropriate masking and etching is carried out to create gate electrode layer 13 and insulating thin layer 10, respectively, as the final structure shown in FIG. 3a.

Figure 3B:
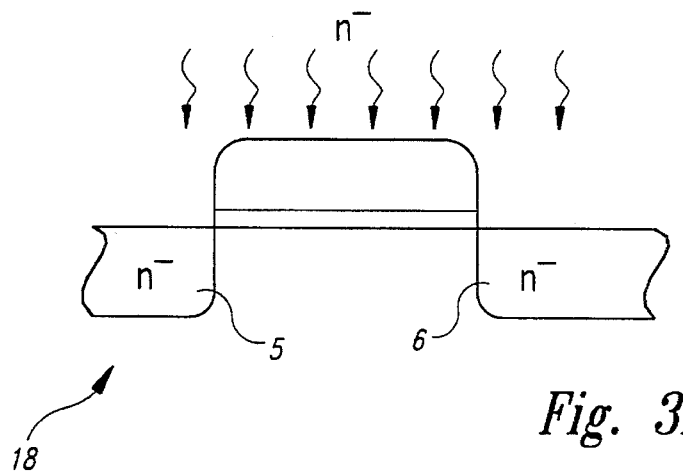

A low concentration of impurities is implanted into the region that will become the source region 5 and drain region 6, as shown in FIG. 3b. For purposes of an n-channel device, an n-conductivity type impurity such as arsenic, or phosphorous, are acceptable for this step, however if a p-channel device is desired, a p-conductivity type impurity such as boron is utilized. A reversal of conductivity type must be made in each processing step calling for the introduction of an impurity as will readily be appreciated by those of ordinary skill in the art if a p-channel device rather than an n-channel device is to be constructed.

Figure 3C:
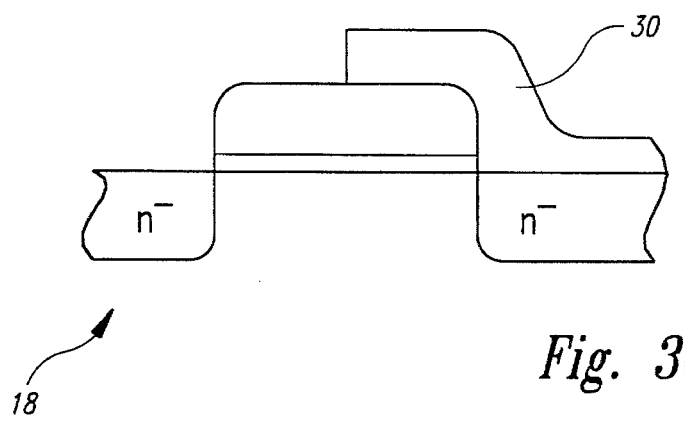

According to a first embodiment of the present invention, a programming mask 30 is formed as shown in FIG. 3c. The programming mask covers a portion of gate electrode layer 13 and extends over all the drain region 6, while an aperture formed over source region 5 is left unmasked. Alternatively, source region 5 may be masked as well to protect the source region from crystal damage due to a subsequent implantation step that will be discussed below. As a further alternative, the drain region 5 may also be partially or fully unmasked.

Figure 3D:
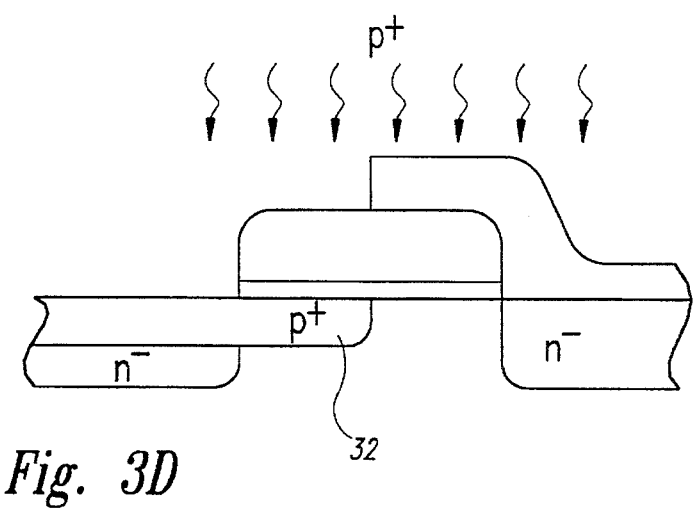

Subsequently and advantageously, a sufficiently high energy programming implant 32 of a moderate concentration, e.g., 10E14 atoms/cm$^3$ of the opposite conductivity type impurity to that of the source and drain implants above, and of the first conductivity type is made as shown in FIG. 3d. The energy is selected to be high enough so that the impurity ions penetrate completely the gate electrode layer 13 and the thin layer 10 to reach the channel area 9.

Figure 3E:
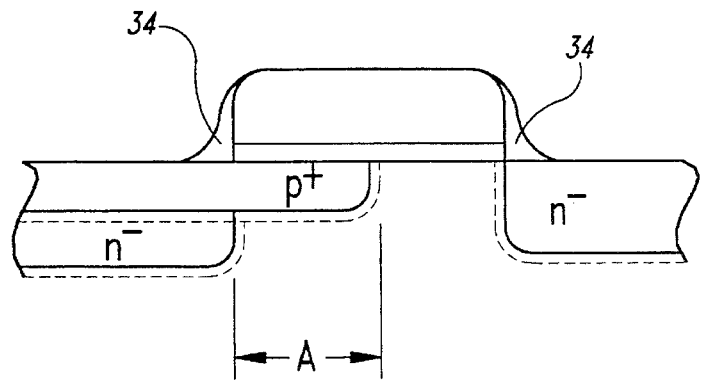

An oxide layer is then formed and anisotropically etched to leave sidewalls 34 as shown in FIG. 3e. Sidewalls 34 provide masking for a subsequent implantation step to be discussed below. Heating of the cell during oxide growth will result in diffusion of impurities. In particular, the boron impurities implanted during the programming implantation will spread underneath the gate 13 and thus extend a distance A laterally into the channel region 9. The distance A is controllable to high precision as will be readily appreciated by one of ordinary skill in the art.

Figure 3F:
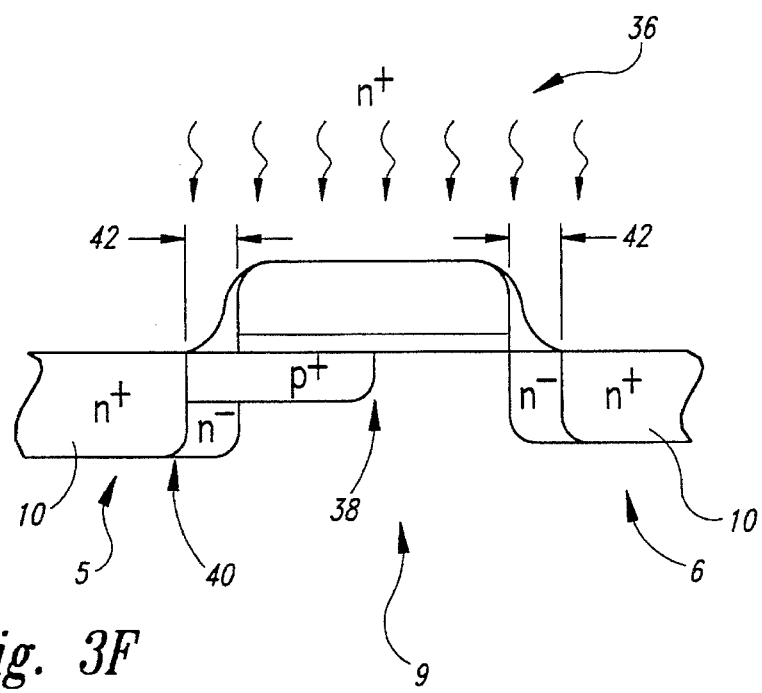

With reference to FIG. 3f, a high concentration, e.g., 10E16 atoms/cm$^3$, source/drain implant 36 of n-type impurity is next made to form a high concentration region 10 of source 5 and drain 6. The high concentration implant will be masked by and thus abut the longitudes defined by outer edges of the sidewalls 34. A front 38 of the programming implant will thus be a lateral separation distance from a front 40 of the source/drain implant equal to the distance A plus the width 42 of the sidewalls 34. This separation distance will be maintained during a subsequent heating step under the assumption that the diffusivities of both the n-type and the p-type impurities are similar. In reality, boron diffuses laterally farther than arsenic for a given heating profile so if the dopant is boron, it will always be farther into the channel than the n-type dopants and the distance A shown in FIG. 3e may increase slightly.

Figure 3G:
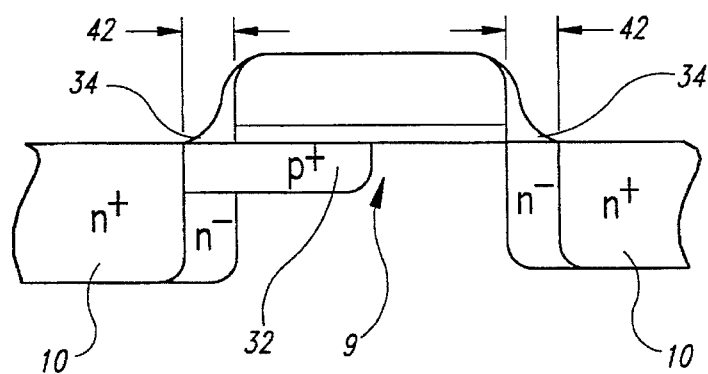

With reference to FIG. 3g, the substrate is subjected to subsequent heating steps that diffuse the source/drain implant far enough so that it extends underneath the gate and activates the FET function for gates to be programmed on. For cells that receive the programming implant, the programming implant 32 will thus be diffused to extend into the channel region 9 the selected separation distance discussed herein to achieve the advantages disclosed herein. The ROM array is completed using subsequent steps known in the art for providing the metal layers and other interconnecting and final layers.

Figure 4A:
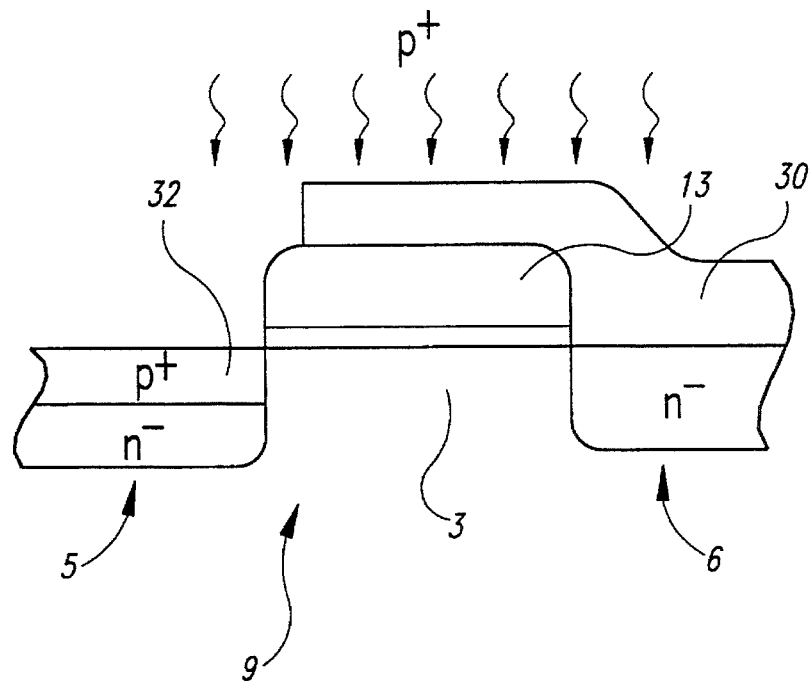
FIGS. 4a–4d are cross-section views showing schematically a cell structure at successive steps of manufacture according to another preferred embodiment of the invention.

With reference to FIG. 4a, an alternative embodiment of the present invention implants advantageously into the source region only a doping impurity 32 of a moderate to high concentration of the same conductivity type as the substrate and the opposite of the source and drain implants. According to this alternative embodiment, the programming mask 30 overlays both the drain region 6 and the entire polysilicon gate electrode 13 to mask the substrate region under each from receiving the implant 32. An aperture is provided solely over the source region, or the portion of the source region adjacent the gate. An ion implantation is then performed as shown in FIG. 4a.

Figure 4B:
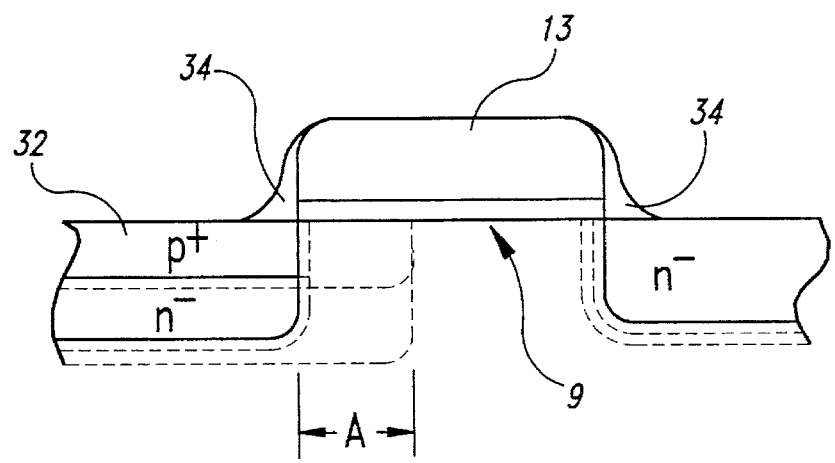

An oxide layer is then formed and anisotropically etched to leave sidewalls 34 which provide masking for subsequent implantation steps as shown in FIG. 4b. Heating of the cell during oxide growth will result in diffusion of impurities. In particular, the impurities of the implant will migrate underneath the gate 13 a distance A laterally into the channel region 9. The distance A is controllable to high precision to form a programming profile to be discussed below.

Figure 4C:
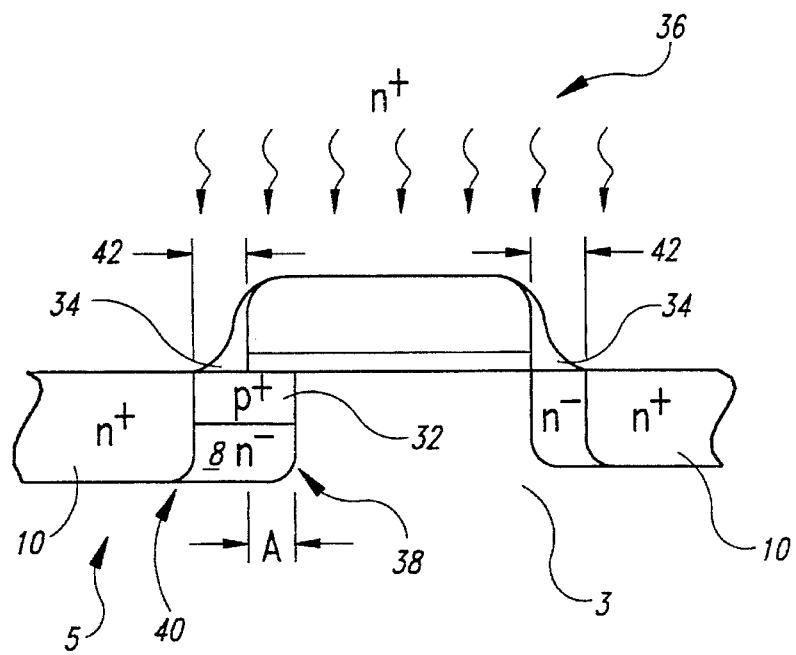

With reference to FIG. 4c, a high concentration source/drain implant 36 of n-type impurity is next made to form a high concentration region 10 of source 5 and drain 6. The high concentration implant will be masked by and thus abut the region defined by outer edges of the sidewalls 34. The front 38 of the implant 32 will thus be a lateral separation distance from the front 40 of the high concentration region 10 equal to the distance A plus the width 42 of the sidewalls 34. This separation distance will be maintained during a subsequent heating step under the assumption that the diffusivities of the impurities are similar. In reality, boron diffuses laterally farther than arsenic for a given heating profile so if the dopant is boron, it will generally be farther into the channel than the n-type dopants of region 8.

FIG. 4c is not intended to be exactly to scale because, in fact, the locations of the p+ implant region 32 after a heating step may be further into the channel region than the n-implant region because of different diffusion rates.

Figure 4D:
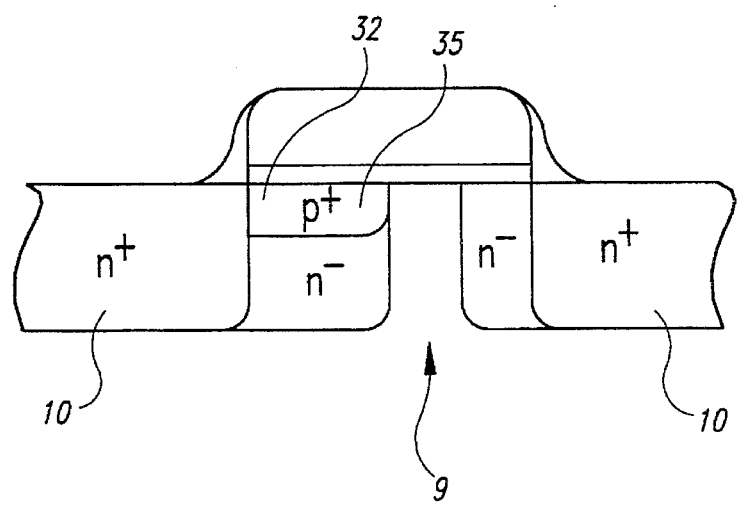

With reference to FIG. 4d, the cell is completed by subsequent processing steps, which may include heating that then diffuses the high concentration region 10 far enough so that it extends underneath the gate and activates the FET function for the desired ROM cells. The impurity 32 is thus transformed into programming profile 35 extending into the channel region 9 the selected distance discussed herein to achieve the advantages disclosed herein.

This results for each of the embodiments described herein, in a channel region 9 having a portion whose doping concentration of a first conductivity type that is relatively low and usually equal to that of the substrate and a portion whose doping concentration is much higher than that of the substrate but of the same conductivity type, that portion extending into the channel region solely from the source side for a selected distance.

The embodiments which have just been described are of the type in which graded junctions are formed in the drain and source regions by implanting low concentration n-type impurities to form the regions 8. The source and drain regions are completed by a heavy doping region 10. According to this alternative embodiment, graded junctions are not used and the regions 8 are not formed. Alternatively, even if a graded junction is used the implant of the p-type diffusion to form region 32 may occur either prior to or after the low concentration doping of n-type impurities. In addition, the depositing of the oxide layer and anisotropic etching to form the sidewalls 34 are not performed in some embodiments and are not necessary to implement the methods of the invention. Rather, these are described as advantageous when the channel length is extremely small and also to illustrate steps which are currently carried out by some processes known to those with ordinary skill in the art.

The concentration of p-type ion impurities implanted to form the diffusion region 32 is sufficient to form a p+ region in the channel near the source. This creates a p doping concentration in the channel region adjacent the source which is higher than the p-type doping concentration in the channel region adjacent the drain. The concentration is selected to be sufficiently high to form an increased doping concentration in the channel near the source but is low enough not to alter the conductivity of the heavily doped n-type source region. Furthermore, the heating steps are to be understood as not expressly requiring a single step. Rather, the semiconductor substrate may undergo one or more heat cycles during the final manufacturing treatments and the diffusions described herein may occur during such heat cycles.

In addition, there are some ROM implantation processes which call for the implantation to occur after the source/ drain implants 10 are formed or after the metal layer is formed and a sufficiently high implantation energy is used to penetrate through to the substrate. This invention may still be used in such a high energy implantation such that the metal is present prior to the programming step being performed. For programming at one of these later steps in the process, the heating step may not be present, or, if present, may be at a relatively low temperature. The impurities of the same conductivity type as the substrate are implanted directly into the channel region, a diffusion mask having the shape as shown in FIG. 3d being used. Subsequent heating and diffusion is therefore not required in order to cause the impurity concentration to be higher within a selected portion of the channel region. The diffusion regions 10 and/or metal layer can remain intact without undergoing sufficiently high heat treatment steps to destroy the integrity of the memory cells.

Figure 5:
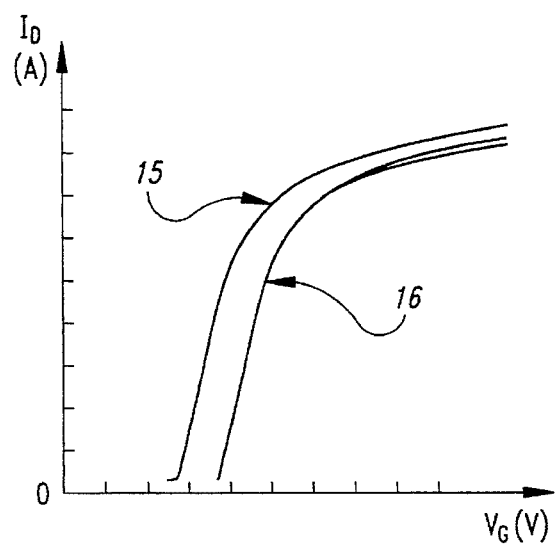
FIGS. 5, 6 and 7 are comparative graphs showing respectively the characteristics of a cell structure according to the invention and cells according to the prior art.

FIG. 5 shows, with the curves 15 and 16, the values of the threshold voltage Vg plotted versus the drain current, curve 15 representing the cell 1 of this invention and curve 16 representing cells made in accordance with the prior art. The threshold of the transistor 2 for the programmed memory cell of the invention is, on the average, 0.5–1 volt lower than that of programmed transistors made according to the prior art. However, this difference is not a significant one because, by appropriate adjustment of the dopant concentration, the threshold voltage of the cell programmed can be kept above the gate voltage when the ROM is addressed, such as 5 volts or some other selected voltage, such as 2.5 or 3 volts, so that it can be distinguished from a non-programmed cell.

Figure 6:
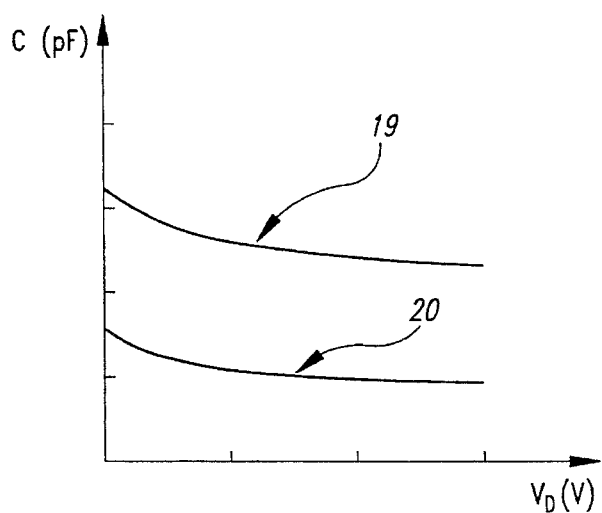

Compared in FIG. 6 through the curves 19 and 20 is the capacitance C of the bit line of a ROM comprising programmed cells of a conventional design having a full channel implant, curve 19, with that of cells made in accordance with this invention having an implant extending only from the source region, curve 20. As can be seen, the capacitance is lower for the programmed cells according to the invention than for the prior art programmed cells, resulting in faster access times to a memory made from the inventive memory cells than from a memory composed of memory cells and structured according to the prior art.

Figure 7:
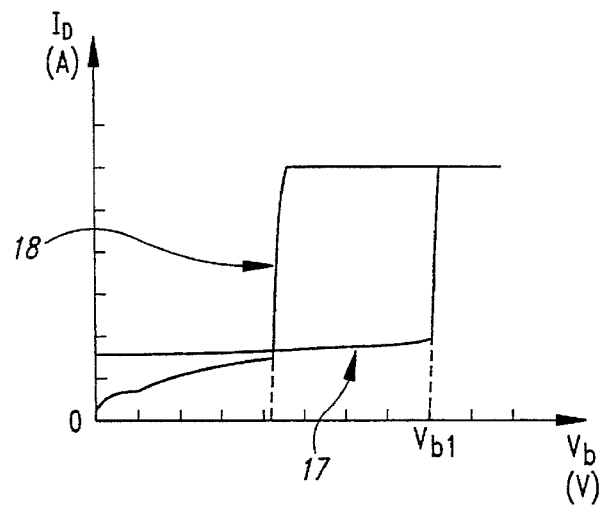

As shown in FIG. 7, the cell 1 of this invention has a breakdown voltage Vb which is definitely higher than that of conventional cells.

In this respect, it may be appreciated from FIG. 7 that the Vb value for the cell 1 is about 16 volts (curve 17) as against the 9 volts of conventional cells (curve 18).

Among numerous advantages of the method of the present invention to provide a programmed cell structure for read-only memory circuits having low capacitance and high breakdown voltage, the first preferred embodiment disclosed herein includes the advantage that the programming mask 30 need not be critically registered to the gate electrode layer 13 beyond the relatively noncritical requirement to control the general length of the programming implant. A first preferred embodiment of the present invention still further includes the advantage that the programming profile may be highly controlled if desired.

Advantages of a second preferred embodiment of the method of the present invention disclosed herein include that the lateral extent of the programming implant may be limited to only a small percentage of the channel length. A further advantage is that physical damage to the semiconductor substrate is minimized due to the relatively low energy of the nucleating implant.

It is to be understood that even though numerous advantages of the present invention have been set forth in the foregoing description, the above disclosure is illustrative only. Changes may be made in detail and yet remain within the broad principles of the present invention. Therefore, the present invention is to be limited only by the appended claims.

We claim:

1. A method of manufacturing a programmed memory cell of a read-only memory array comprising the steps of:

defining an active area for a field effect memory element on a semiconductor substrate having a first conductivity type, the active area having a channel region, and a source region and a drain region on opposite sides of the channel region;

forming a gate insulating layer overlying at least a portion of the active area;

forming a gate electrode of uniform thickness overlying the gate insulating layer and positioned over the channel region;

forming a programming mask having a programming mask aperture positioned over at least a portion of the source region;

implanting a doping impurity of the first conductivity type into the semiconductor substrate through the programming mask aperture to program the memory cell;

implanting a doping impurity of a second conductivity type into the gate electrode and into the source and drain regions, causing the gate electrode and the source and drain regions to be doped with the second conductivity type impurity; and heating the semiconductor substrate to diffuse the doping impurity of the first conductivity type into the channel region and of the second conductivity type into the gate electrode of the source region and the drain regions.

2. The method according to claim 1 wherein the heating step occurs at two or more distinct times.

3. A method of manufacturing a programmed memory cell of a read-only memory array comprising the steps of:

defining an active area for a field effect memory element on a semiconductor substrate having a first conductivity type;

forming a gate insulating layer upon the active area;

forming a gate electrode upon the gate insulating layer and overlaying a channel region having a source region on one side thereof and a drain region on the other side thereof;

forming a programming mask having a programming aperture that overlays at least a selected portion of the source region and does not overlay any portion of the channel region into which it is desired to introduce a doping impurity having the first conductivity type into the semiconductor substrate; and programming the memory cell by implanting a first doping impurity of the first conductivity type into the semiconductor substrate at the selected portions of the source region overlaid by the programming mask aperture to program the memory cell;

implanting a second doping impurity of the second conductivity type into the substrate for forming the source and drain regions; and heating the semiconductor substrate to cause the doping impurity of the first conductivity type to diffuse laterally a distance into the channel region in the active area to program the memory cell.

4. The method according to claim 1 wherein the programming mask aperture overlays at least a portion of the source region and does not overlay any portion of the channel region such that the first doping impurity is implanted only into the source region and the subsequent heating of the substrate after the implanting of the doping impurity of the first conductivity type causes the first doping impurity to diffuse laterally a distance into the channel region.

5. The method according to claim 1 wherein the programming mask aperture overlays at least a portion of the source region and only a portion of the channel region such that the doping impurity is implanted directly into a portion of the channel region and the subsequent heating step causes the first doping impurity to diffuse to a distance into the channel region.

6. The method according to either of claims 4 or 5 in which the distance the impurity of the first conductivity type is diffused into the channel region is greater than 10% of the channel length but less than 80% of the channel length.

7. The method according to either of claims 4 or 5 in which the distance the impurity of the first conductivity type is diffused into the channel region is less than 50% of the channel length.

8. The method according to claim 1 in which the steps of forming a programming mask and programming the memory cell by implanting the first doping impurity occur after the second doping impurity is implanted to form the source and drain regions.

9. The method according to claim 1, further including:

depositing and etching a metal layer onto the semiconductor substrate prior to performing the steps of forming a programming mask and programming the memory cell by implanting a first doping impurity.

10. The method according to claim 1 wherein the programming mask completely covers the channel region and source region of selected memory cells in the array that are not programmed.

* * * * *